(12) United States Patent
Wills et al.

(10) Patent No.: US 10,713,906 B2
(45) Date of Patent: Jul. 14, 2020

(54) PORTABLE ELECTRONIC DEVICE FOR MONITORING AND ALERTING ABOUT THE PRESENCE OF AN OBJECT

(71) Applicant: Step Safely, LLC, Beckley, WV (US)

(72) Inventors: David Ervin Wills, Shady Spring, WV (US); Diana Leigh Wills, Shady Spring, WV (US); David Lee Bays, Crab Orchard, WV (US); Anastasia Victoria Bays, Crab Orchard, WV (US)

(73) Assignee: Step Safety, LLC, Beckley, WV (US)

( * ) Notice: Subject to any disclaimer, the term of this patent is extended or adjusted under 35 U.S.C. 154(b) by 0 days.

(21) Appl. No.: 16/553,669

(22) Filed: Aug. 28, 2019

(65) Prior Publication Data

US 2020/0074817 A1 Mar. 5, 2020

Related U.S. Application Data

(60) Provisional application No. 62/723,500, filed on Aug. 28, 2018.

(51) Int. Cl.
| | |
|---|---|
| *G08B 1/08* | (2006.01) |
| *G08B 3/10* | (2006.01) |
| *G08B 5/38* | (2006.01) |
| *H03K 17/60* | (2006.01) |
| *G08B 7/06* | (2006.01) |
| *G05F 3/18* | (2006.01) |
| *G08B 5/22* | (2006.01) |

(52) U.S. Cl.
CPC ............ *G08B 1/08* (2013.01); *G05F 3/18* (2013.01); *G08B 3/1016* (2013.01); *G08B 5/223* (2013.01); *G08B 5/38* (2013.01); *G08B 7/06* (2013.01); *H03K 17/60* (2013.01)

(58) Field of Classification Search
None
See application file for complete search history.

(56) References Cited

U.S. PATENT DOCUMENTS

| | | | |
|---|---|---|---|
| 6,578,663 B2 | 6/2003 | Schmitt et al. | |
| 6,657,547 B2 | 12/2003 | Ching-Yao | |
| 8,638,232 B2 * | 1/2014 | Olson | ........ E06C 7/003 340/692 |

(Continued)

*Primary Examiner* — Thomas S McCormack
(74) *Attorney, Agent, or Firm* — Dinsmore & Shohl LLP; Monika L'Orsa Jaensson, Esq.

(57) ABSTRACT

A portable electronic device used for monitoring and alerting about the presence of an object includes an enclosure having a portability mechanism and an electronic circuit having a motion detection sensor, a bipolar junction transistor, an alert generator, a Bluetooth® module and a power source coupled to the motion detection sensor, the bipolar junction transistor, the alert generator and the Bluetooth® module. The motion detection sensor is configured to detect movement of the object across an area in front of the sensor and generate a timed output signal. The bipolar junction transistor is communicatively coupled to the motion detection sensor and configured to activate a control signal in response to the timed output signal. The alert generator and the Bluetooth® module are communicatively coupled to the bipolar junction transistor and configured to produce an alert and a Bluetooth® signal respectively in response to the control signal.

18 Claims, 8 Drawing Sheets

(56) References Cited

U.S. PATENT DOCUMENTS

| | | |
|---|---|---|
| 8,669,859 B2 | 3/2014 | Wang |
| 8,724,608 B2* | 5/2014 | Bird .................... H04L 12/2803 |
| | | 370/343 |
| 9,582,976 B2 | 2/2017 | Chin et al. |
| 9,772,671 B1* | 9/2017 | Lee ...................... G08B 25/008 |
| 10,094,170 B2 | 10/2018 | Friedman |
| 2005/0173189 A1 | 8/2005 | Berardi |
| 2009/0139798 A1* | 6/2009 | Bernard ................ E06C 7/003 |
| | | 182/18 |
| 2010/0018800 A1 | 1/2010 | Ventura et al. |
| 2011/0148645 A1 | 6/2011 | Sarmiento |
| 2013/0140111 A1 | 6/2013 | Desai |
| 2014/0231170 A1 | 8/2014 | Frame et al. |
| 2016/0110981 A1* | 4/2016 | Chin .................... A01M 29/10 |
| | | 340/573.1 |

* cited by examiner

PORTABLE ELECTRONIC DEVICE FOR MONITORING AND ALERTING ABOUT THE PRESENCE OF AN OBJECT

CROSS REFERENCE

This application claims priority to U.S. Provisional Patent Application No. 62/723,500 entitled "Ladder Safety Device" and filed on Aug. 28, 2018, which is hereby incorporated by reference in its entirety.

TECHNICAL FIELD

Embodiments described herein generally relate to apparatuses for monitoring and alerting about the presence of an object and, more specifically, to an electronic circuit configured to monitor and alert about the presence of an object and to a portable electronic device incorporating such an electronic circuit.

BACKGROUND

A variety of objects are present in the way of people walking and moving in everyday life. People busy with their everyday lives are often not attentive to these objects present in their way. As a result, these objects pose risk of accidents that can often lead to serious injuries. As an example, busy people are often inattentive to rungs or steps of a stepping structure such as a ladder, especially while climbing down. This results in missteps or falls after landing that can cause serious injuries. As another example, bikers are often unsure if a moving object or pedestrian is moving into their path and injure themselves in the event of a collision. This can also lead to serious injuries. Accordingly, it is desirable to have a low-cost portable electronic device for monitoring and alerting about the presence of an object to prevent occurrences of injuries.

SUMMARY

Embodiments disclosed herein generally relate to apparatuses for monitoring and alerting about the presence of an object. In one embodiment, an electronic circuit for a portable electronic device used for monitoring and alerting about the presence of an object is disclosed. The electronic circuit includes a motion detection sensor, a bipolar junction transistor, an alert generator, a Bluetooth® module and a power source coupled to the motion detection sensor, the bipolar junction transistor, the alert generator and the Bluetooth® module. The motion detection sensor is configured to detect movement of the object across an area in front of the sensor and generate a timed output signal. The bipolar junction transistor is communicatively coupled to the motion detection sensor and configured to activate a control signal in response to the timed output signal. The alert generator is communicatively coupled to the bipolar junction transistor and configured to produce an alert in response to the control signal. The Bluetooth® module is communicatively coupled to the bipolar junction transistor and configured to produce a Bluetooth® signal in response to the control signal.

In another embodiment, a portable electronic device used for monitoring and alerting about the presence of an object is disclosed. The portable electronic device includes an enclosure having a portability mechanism and an electronic circuit positioned within the enclosure. The electronic circuit includes a motion detection sensor, a bipolar junction transistor, an alert generator, a Bluetooth® module and a power source coupled to the motion detection sensor, the bipolar junction transistor, the alert generator and the Bluetooth® module. The motion detection sensor is configured to detect movement of the object across an area in front of the sensor and generate a timed output signal. The bipolar junction transistor is communicatively coupled to the motion detection sensor and configured to activate a control signal in response to the timed output signal. The alert generator is communicatively coupled to the bipolar junction transistor and configured to produce an alert in response to the control signal. The Bluetooth® module is communicatively coupled to the bipolar junction transistor and configured to produce a Bluetooth® signal in response to the control signal.

BRIEF DESCRIPTION OF THE DRAWINGS

The embodiments set forth in the drawings are illustrative and exemplary in nature and not intended to limit the disclosure. The following detailed description of the illustrative embodiments can be understood when read in conjunction with the following drawings, where like structure is indicated with like reference numerals and in which.

DETAILED DESCRIPTION

Embodiments disclosed herein relate to an electronic circuit configured to monitor and alert about the presence of an object and to a portable electronic device incorporating such an electronic circuit. The electronic circuit includes a motion detection sensor that is configured to detect movement of an object (for example, a human body) by sensing radiation emitted or reflected by the object and generate a timed output signal. A bipolar junction transistor (BJT) is used to receive the timed output signal and activate a control signal in response. The control signal is then used to generate a visual or audible alert and/or a Bluetooth® signal to mobile device to alert a user of the presence or absence of the object. The electronic circuit is placed within a custom designed enclosure having a portability mechanism that allows the electronic device thus formed to be detachably positioned adjacent to an area desired to be monitored such that the presence of objects in the area are detected and alerted about.

Figure 1:
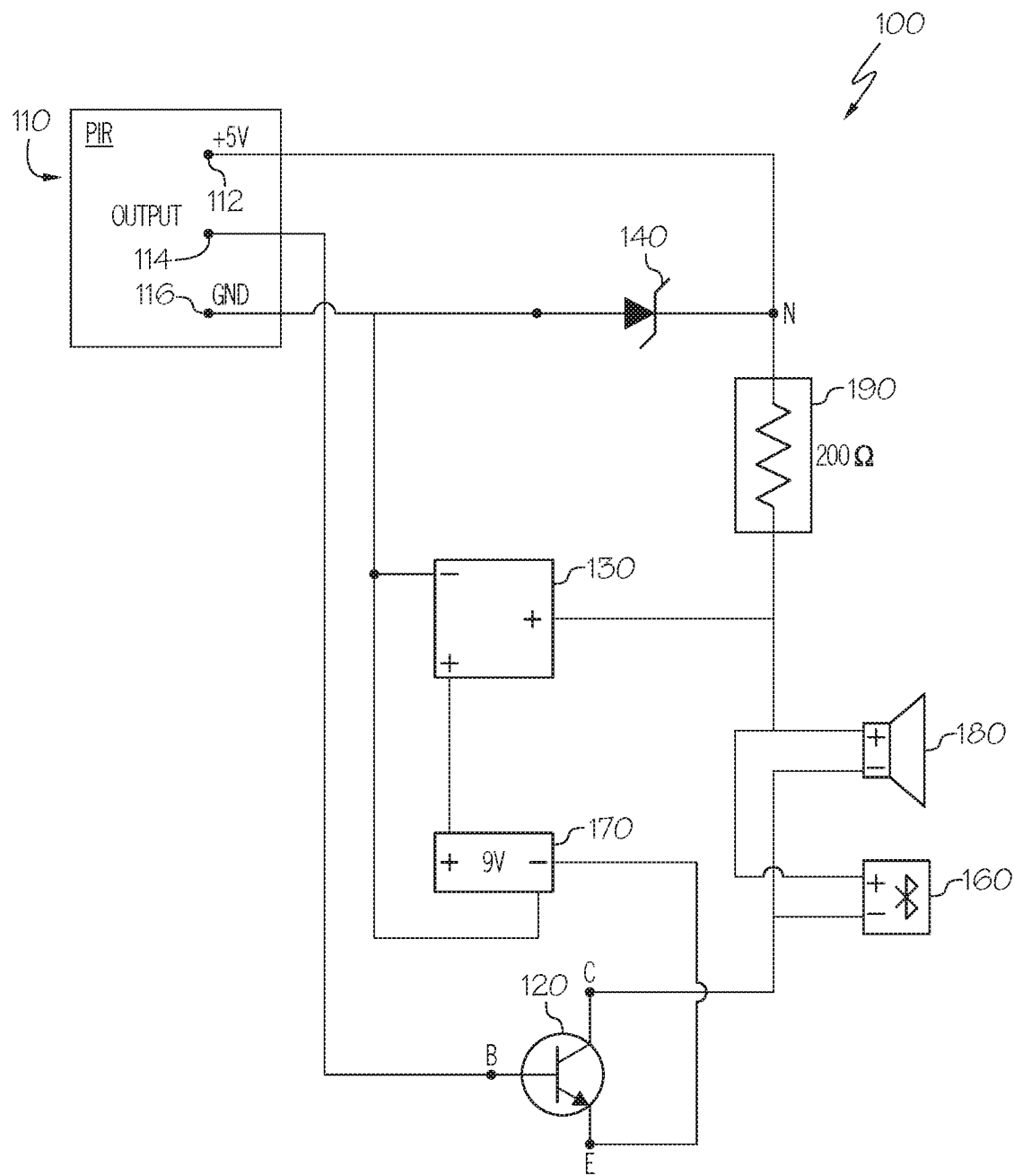
FIG. 1 depicts an electronic circuit for a portable electronic device used for monitoring and alerting about the presence of an object, according to embodiments described herein.

FIG. 1 depicts an example electronic circuit 100 designed according to principles embodied by the disclosure. The particular embodiment shown in FIG. 1 and described herein should not be construed as limiting as such and any reasonable variation within the constraints of the principles is intended to be included within the scope of the disclosure. As shown in FIG. 1, the electronic circuit 100 includes a motion detection sensor 110 having three pins 112, 114, and 116 interfacing with the electronic circuit 100. The pin 112 supplies 5V power to the motion detection sensor 110, while pin 116 is connected to ground. The pin 114 delivers a timed 3.3V transistor-transistor logic (TTL) output signal, where "HIGH" or "1" indicates detection of motion and "LOW" or "0" indicates lack of detection of motion. The motion detection sensor 110 is configured to adjust time of detection between about 3 seconds and about 5 seconds and to adjust sensitivity of detection between about 0.3 meters to about 0.6 meters. The motion detection sensor 110 used in the electronic circuit 100 is a passive infrared (PIR) motion detector and is described in greater detail with respect to FIGS. 6A-6B, However, in other embodiments, other sensors such as, but not limited to, a laser sensor, an ultrasonic sensor, a microwave sensor, or a proximity sensor may be used instead of a PIR motion detector.

A BJT 120 communicatively coupled to the motion detection sensor 110 is configured to receive the timed 3.3V TTL output signal from the motion detection sensor 110. The BJT 120 has a base B, collector C and an emitter E. In the non-limiting embodiment shown in FIG. 1, the BJT 120 may be a commercially available NPN transistor or a PNP transistor such as, but not limited to, 2N3904 (NPN) and 2N3906 (PNP) transistors. The BJT 120 is configured to activate a control signal in response to the timed 3.3V TTL output signal. In different embodiments, however, other switching components may be used as appropriate with the application, instead of the BJT 120.

The BJT 120 is a low-cost and high-reliability component that confers distinct advantages and a longer life over other switching components. The BJT 120 is capable of operating at a high frequency which is required for quick detection of objects, especially for applications in high traffic areas. In addition, the BJT 120 is not susceptible to electromagnetic interference unlike another switching component, such as a relay.

A Bluetooth® module 160 and an alert generator 180 which are both communicatively coupled to the collector C of the BJT 120 are configured to receive the control signal. In the embodiment shown in FIG. 1, the Bluetooth® module 160 and the alert generator 180 are situated in a parallel configuration such that the electronic circuit 100 can simultaneously produce bath Bluetooth® signal and an alert in response to the control signal. In different embodiments however, the Bluetooth® module 160 and the alert generator 180 may be situated in a series configuration such that the electronic circuit 100 can produce either a Bluetooth® signal or an alert in response to the control signal.

The Bluetooth® module 160 is a commercially available electronic circuit card that can be programmed to receive the control signal from the BJT 120 and produce a Bluetooth® signal in response to the control signal. The Bluetooth® signal, in the form of low-power radio waves with a frequency between about 2.402 GHz and about 2.48 GHz, is then transmitted in accordance with the Bluetooth® wireless communication protocol to one or more devices capable of receiving the Bluetooth® signal such as, but not limited to, a mobile device. An application on the mobile device may be configured to determine a visual, audible or tactile alert transmitted through the Bluetooth® signal.

Figure 7:
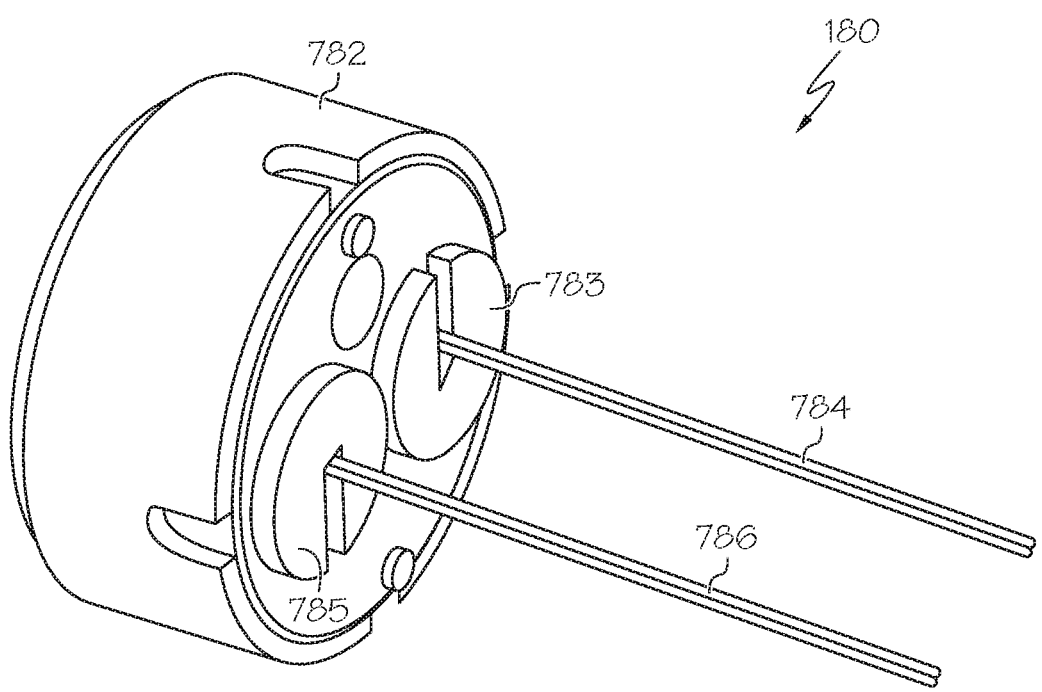
FIG. 7 depicts a perspective view of a piezo sounder used in the portable electronic device of FIG. 2, according to embodiments described herein.

The alert generator 180 is a commercially available piezo sounder and is described in greater detail with respect to FIG. 7. In the embodiment shown in FIG. 1, the alert generator 180 is configured to produce a sound alert in response to the control signal from the BJT 120. In different embodiments, however, the alert generator 180 may be an audio speaker configured to deliver a message in response to the control signal or a flashing light configured to produce light in response to the control signal.

The electronic circuit 100 includes a power source 170 configured to electrically power the motion detection sensor 110, the BJT 120, the Bluetooth® module 160 and the alert generator 180 as shown in FIG. 1. While in the embodiment shown in FIG. 1, the power source 170 is a 9V battery, in other embodiments, the power source 170 may be an AA battery, or an AAA battery as commercially available. In yet other embodiments, a step-down transformer connected to a 120V power outlet and coupled to an AC-DC converter may be used in addition or instead of the power source 170. The step-down transformer with the AC-DC converter can be configured to step down 120V from the power outlet to an appropriate DC voltage (e.g. 9V) for applications of the electronic circuit 100.

A Zener diode 140 is coupled to the power source 170 and configured to regulate 9V generated by the power source 170 to 5V supplied to the alert generator 180 and the Bluetooth® module 160. An anode of the Zener diode 140 is coupled to ground and a cathode of the Zener diode 140 is coupled to a circuit node N connecting to both the alert generator 180 and the Bluetooth® module 160. The Zener diode 140 may be a commercially available component such as, but not limited to, a 1N4733 diode.

A light-emitting diode (LED) on/off switch 130 is communicatively coupled to the power source 170 and configured to indicate whether the power source 170 is turned on or off. In the embodiment shown in FIG. 1, the LED on/off switch 130 is a commercially available component that operates at 3V. Additionally, a resistor 190 having a resistance of about 200 Ohms is coupled to the LED on/off switch 130. The resistor 190 is configured to step down 5V flowing into the resistor 190 to a 3V voltage input into the LED on/off switch 130.

Figure 2:
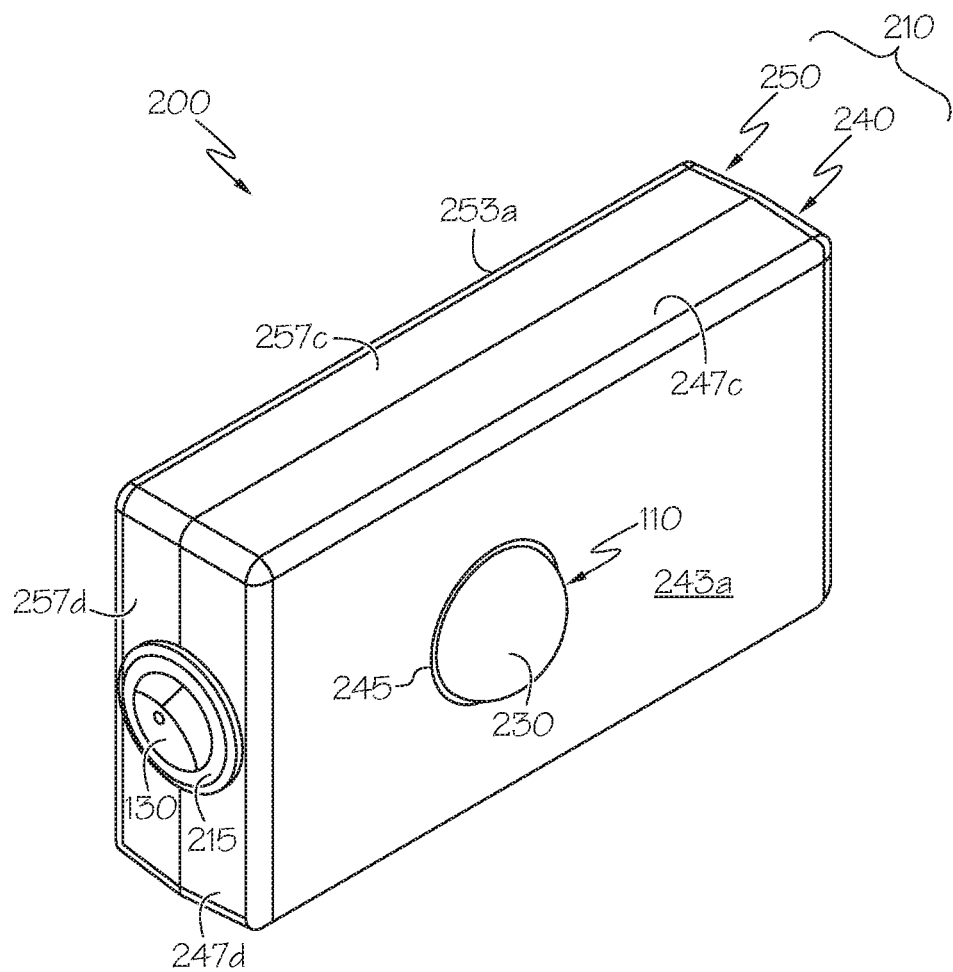
FIG. 2 depicts a portable electronic device incorporating the electronic circuit of FIG. 1, according to embodiments described herein.

FIG. 2 depicts a portable electronic device 200 incorporating the electronic circuit 100 of FIG. 1. The portable electronic device 200 includes an enclosure 210 having a front cover 240 and a back cover 250. The enclosure 210 may be constructed of a metallic material such as, but not limited to stainless steel and carbon steel or a non-metallic material such as, but not limited to, plastic, polycarbonate, and fiberglass-reinforced polyester. The enclosure 210 may be constructed from a waterproof or water resistant material and may be printable by a 3-D printer. In addition, the electronic circuit 100 can be made waterproof by using an appropriate waterproofing chemical coating that prevents damage to any of the components described above.

Figure 5:
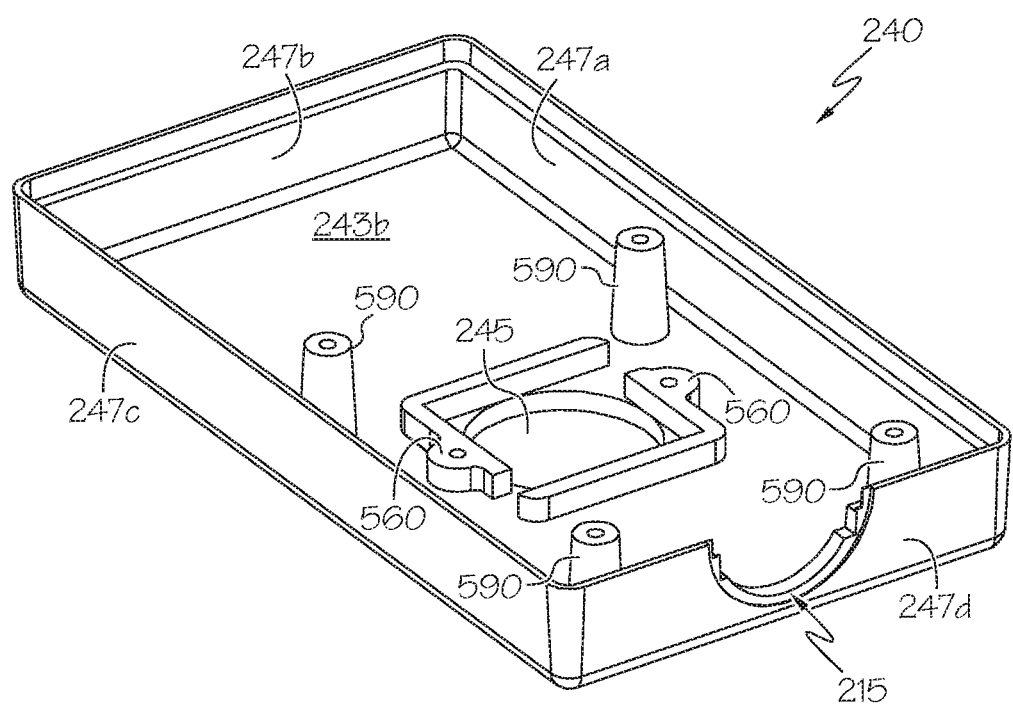
FIG. 5 depicts a perspective view of an interior part of a front cover of the enclosure of the portable electronic device of FIG. 2, according to embodiments described herein.

The front cover 240 has an exterior surface 243a, an interior surface 243b and four sidewalls 247a, 247b, 247c, and 247d (also shown in FIG. 5). The back cover 250 has an exterior surface 253a, an interior surface 253b and four sidewalls 257a, 257b, 257c, and 257d (also shown in FIGS. 3A-3B), The sidewall 247d of the front cover 240 and the sidewall 257d of the back cover 250 each contain semicircular portions of a circular aperture 215 of the enclosure 210. The LED on/off switch 130 of the electronic circuit 100 is accommodated through the aperture 215 and protrudes outside the enclosure 210. The front cover 240 further includes an aperture 245 through the exterior surface 243a and the interior surface 243b. A lens 230 of the motion detection sensor 110 of the electronic circuit 100 is fitted through the aperture 245 and is exposed to detect infrared radiation generated by objects around the portable electronic device 200.

Figure 3A:
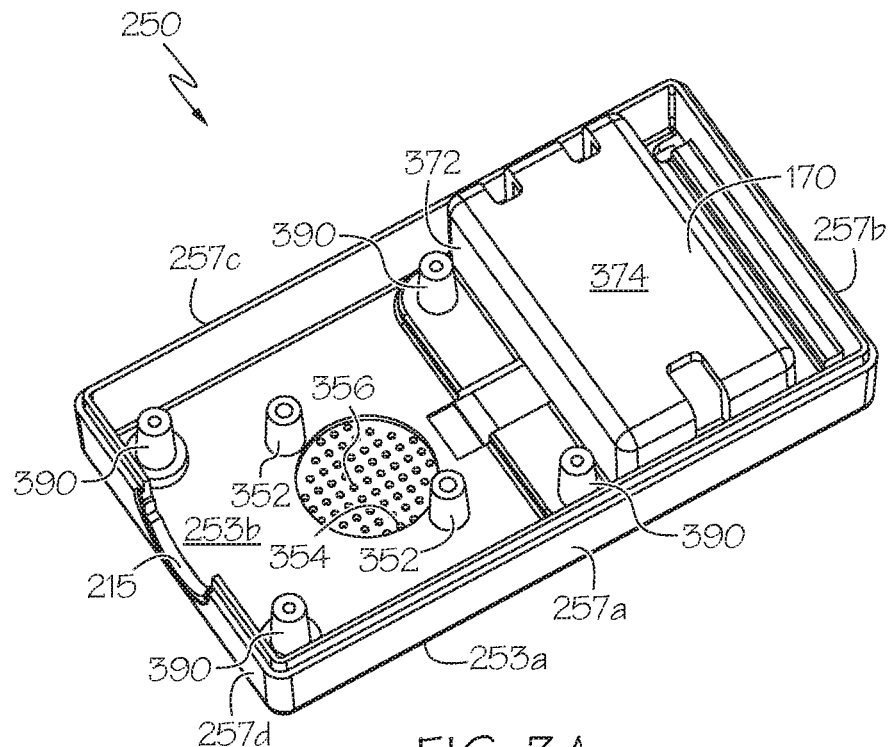
FIGS. 3A-3B depict perspective views of an interior and an exterior of a back cover of an enclosure of the portable electronic device of FIG. 2, according to embodiments described herein.
Figure 3B:
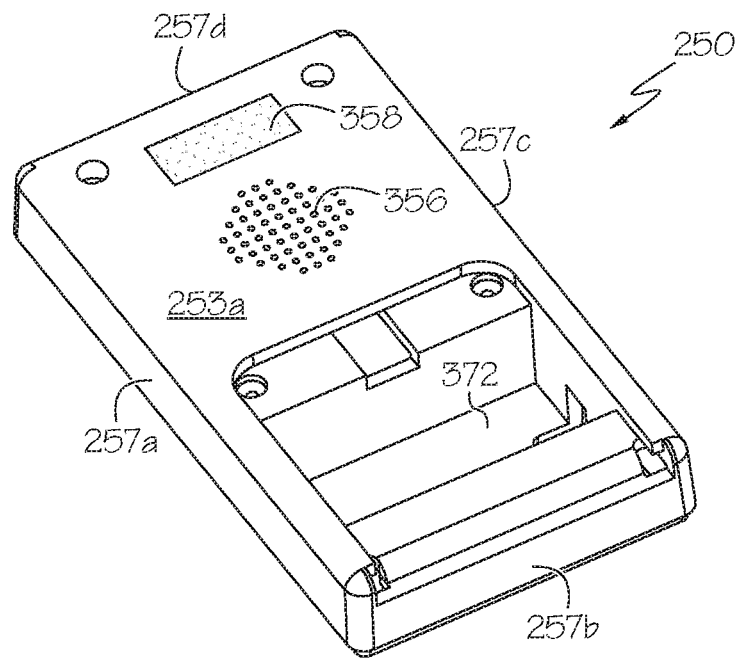
Figure 4A:
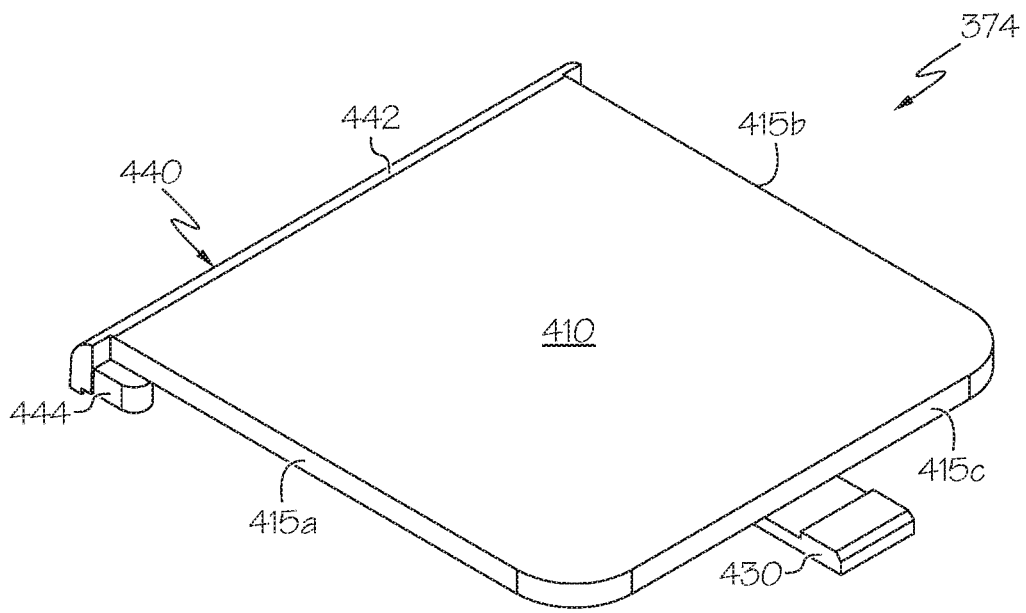
FIGS. 4A-4B depict perspective views of top and bottom surfaces of a lid of a power source compartment of the portable electronic device of FIG. 2, according to embodiments described herein.
Figure 4B:
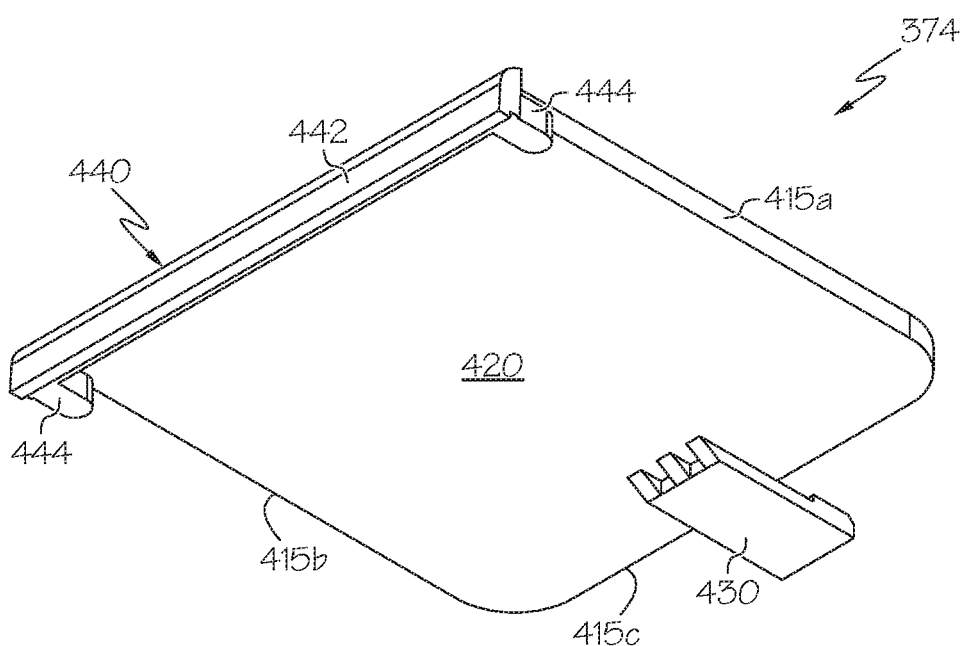

FIGS. 3A-3B depict perspective views of an interior and an exterior of the back cover 250 of the enclosure 210. As described above, the back cover 250 has the exterior surface 253a, the interior surface 253b and the four sidewalk 257a, 257b, 257c, and 257d. The back cover 250 includes four through-holes 390 for mechanically connecting (for example, by using pins) to the front cover 240 to form the enclosure 210. The back cover 250 includes a compartment 372 for housing the power source 170 of the electronic circuit 100. The power source 170 is enclosed under a lid 374, further described with respect to FIGS. 4A-4B.

The back cover 250 also includes two mounts 352 for mounting the alert generator 180 and a recess 354 between the two mounts 352. The alert generator 180 is exposed to the exterior surface 253a of the back cover 250 and the outside environment by means of holes 356 present within the recess 354. While in the embodiment shown in FIGS. 2, 3A-3B and 5, the enclosure 210 is configured to accommodate the alert generator 180 when it is an audio speaker or a piezo sounder, the enclosure 210 may be equivalently configured to accommodate the alert generator 180 when it generates an alert in a different way such as a flashing light. Additionally, the enclosure 210 is also configured to accommodate a transmitter (not shown) for transmitting a Bluetooth® signal generated by the Bluetooth® module 160.

The exterior surface 253a of the back cover 250 includes a portability mechanism 358 that enables the portable electronic device 200 to be detachably coupled to various locations and hence become portable. As shown in FIG. 3B, the portability mechanism 358 is an industrial grade touch fastener such as but not limited to Velcro®. The touch fastener is selected to have a shear strength of at least 10 pounds per square inch such that it can enable the attachment of the portable electronic device 200 to various kinds of surfaces. In other embodiments, the portability mechanism 358 may be a magnetic fastener configured to attach to one or more steel plates disposed on a surface to which the portable electronic device 200 is desired to be attached. In yet other embodiments, the portability mechanism 358 may be an adaptor plate configured to mechanically connect with a C-type clamp coupled to an apparatus such as, but not limited to, a rolling ladder, to which the portable electronic device 200 is desired to be attached.

As noted above, FIGS. 4A-4B depict perspective views of top and bottom surfaces of the lid 374 of the compartment 372 in the back cover 250 for housing the power source 170. The lid 374 includes a top surface 410, a bottom surface 420, and three sidewalk 415a, 415b and 415c between the top surface 410 and the bottom surface 420. The sidewalls 415a and 415b are on a pair of opposite ends of the lid 374. The sidewall 415c has rounded edges. The sidewall 415c and an urging member 440 are disposed on the other pair of opposite ends of the lid 374. The urging member 440 includes a bar 442 and two supports 444 each coupled to the sidewalls 415a and 415b. The bar 442 of the urging member 440 has a width greater than that of the sidewalk 415a, 415b, and 415c. A ridged locking member 430 is coupled to the bottom surface 420 and protrudes perpendicular to the sidewall 415c. The ridged locking member 430 is configured to be manipulated, using a force applied on the urging member 440, into an appropriately shaped socket (not shown) in the compartment 372 to enclose the power source 170 within the enclosure 210.

FIG. 5 depicts a perspective view of an interior part of a front cover 240 of the enclosure 210. As described above, the front cover 240 has the exterior surface 243a, the interior surface 243b, the four sidewalls 247a, 247b, 247c, and 257d, a semicircular portion of the aperture 215 and the aperture 245 for accommodating the lens 230 of the motion detection sensor 110 of the electronic circuit 100. The front cover 240 includes two sensor mounts 560 for mounting the motion detection sensor 110 in way that the lens 230 is exposed outwards through the aperture 245. The front cover 240 further includes four through-holes 590 for mechanically connecting (for example, by using pins) to the back cover 250 to form the enclosure 210.

Figure 6A:
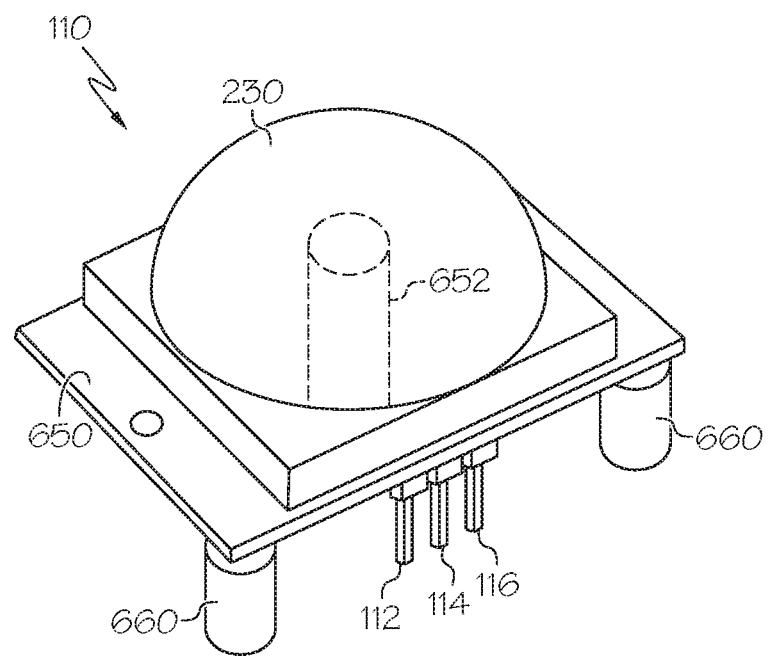
FIGS. 6A-6B depict perspective views of a top end and a bottom end of a motion detection sensor used in the portable electronic device of FIG. 2, according to embodiments described herein.
Figure 6B:
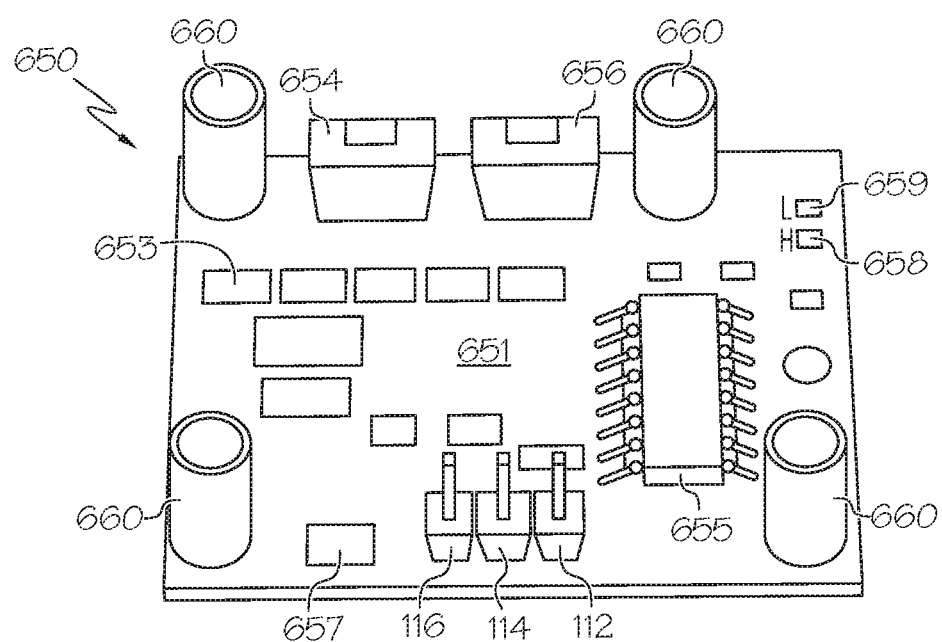

FIGS. 6A-6B depict perspective views of a top end and a bottom end of the motion detection sensor 110 used in the portable electronic device 200. While in the embodiment shown in FIGS. 6A-6B, the motion detection sensor 110 is a commercially available PIE motion sensor HC-SR501, it can be any other kind of sensor configured to detect motion using infrared radiation, laser radiation, ultrasonic radiation, microwave radiation, and the like. The PIE motion sensor HC-SR501 is a highly-sensitive, highly-reliable low-power device based on infrared technology, wherein the lens 230 is coupled to a circuit board 650 coupled to four supports 660. The lens 230 is a Fresnel lens having a diameter of about 23 mm. The lens 230 is configured to focus infrared waves into a pyroelectric detector 652 that converts the infrared radiation into signal charges.

The circuit board 650 includes a printed wiring board 651. A signal processing integrated circuit 655 such as, but not limited to, the microcontroller BISS0001 is used to convert analog signal charges from the pyroelectric detector 652 into a digital TTL output signal transmitted by the pin 114. The pins 112 and 116 are connectable to a power supply and ground respectively. The circuit board 650 has a 3V DC voltage-regulator 653 so it can be powered by any DC voltage 4.5V and 12V, though 5V is used for the purposes of the embodiment shown in FIGS. 1 and 6A-6B. A reverse-polarity protection diode 657 ensures that the current in the circuit only flows from the pin 112 to the pin 116.

The circuit board 650 includes a timing potentiometer 654 for setting how long the digital output will remain "HIGH" or "1" after detection. While this time can be adjusted between 3 seconds and 300 seconds using the timing potentiometer 654, it is limited to between about 3 seconds and about 5 seconds for the purposes of the application of the portable electronic device 200, especially in consideration of the fact that it may be located in a high traffic area, where objects are detected frequently. The circuit board 650 further includes a sensitivity potentiometer 656 for setting a sensitivity distance, i.e. how far the motion of an object can be detected from. While the sensitivity distance can be adjusted between 3 meters and 7 meters using the sensitivity potentiometer 656, it is limited to between about 0.3 meters to about 0.6 meters, for the purposes of the application of the portable electronic device 200.

The circuit board 650 includes two buttons for selecting two different trigger modes—a repeatable (H) trigger button 658 and a non-repeatable (L) trigger button 659. When the repeatable (H) trigger button 658 is selected, the signal processing integrated circuit 655 will continue to generate a digital output of "HIGH" or "1" as long as the pyroelectric detector 652 continues to detect motion of an object within the sensitivity distance set using the sensitivity potentiometer 656. Each detected motion resets a time of detection of an object. On the other hand, when the non-repeatable (L) trigger button 659 is selected, the digital output will remain "HIGH" or "1" for a period of time set by the timing potentiometer 654 provided the object is still within the sensitivity distance set using the sensitivity potentiometer 656.

FIG. 7 depicts a perspective view of a piezo sounder used as the alert generator 180 in the portable electronic device 200. A piezo sounder generates a sound through vibration of a piezoelectric disk disposed over a metal disk, when a voltage is applied to it. The piezoelectric disk may be formed from a piezoelectric material such as, but not limited to, ceramic, quartz, and the like. The piezoelectric disk (not shown) and the metal disk (not shown) are coupled together within the housing 782 of the alert generator 180. The piezoelectric disk is coupled to a lead 784 through an electrode 783, while the metal disk is coupled to a lead 786 through another electrode 785. The leads 784, 786 are electrically connectable to a voltage supply.

Figure 8:
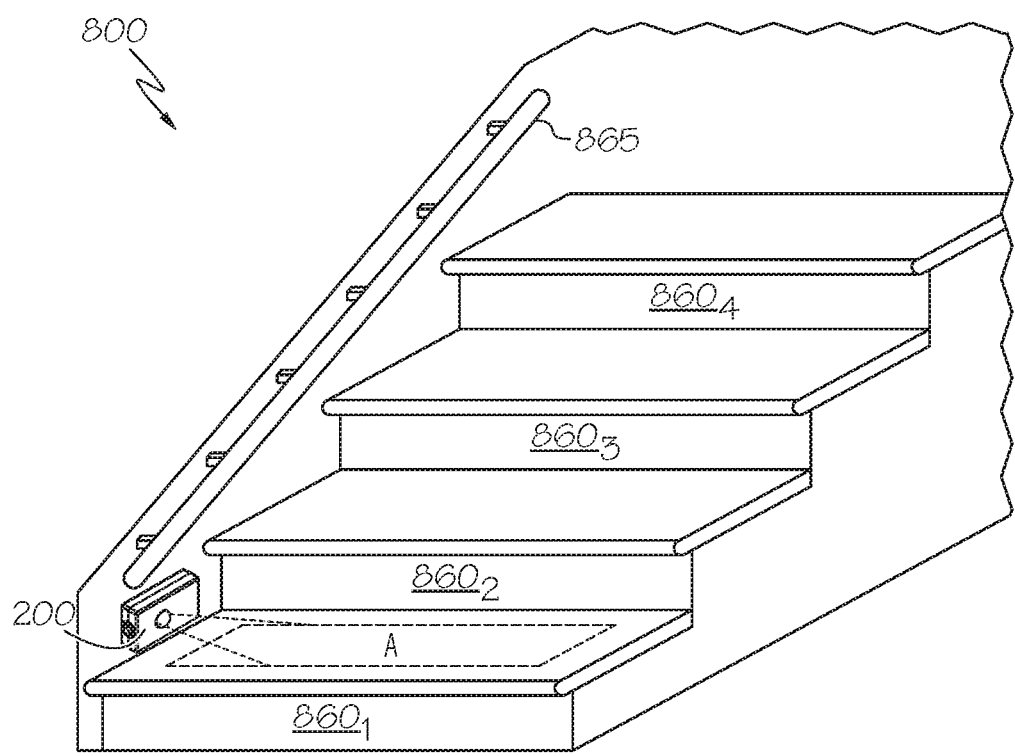
FIG. 8 depicts a perspective view of an application of the portable electronic device of FIG. 2 as installed on a stepping structure, according to embodiments described herein.

FIG. 8 depicts a perspective view of a particular application of the portable electronic device 200 installed on a stepping structure 800 having steps $860_1$, $860_2$, $860_3$, $860_4$, etc. and a handrail 865. In this application, the portable electronic device 200 is installed adjacent to the lowest step $860_1$ using the portability mechanism 358. The portable electronic device 200 monitors an area A on the lowest step $860_1$ and detects whether a person climbing down the stepping structure 800 is stepping on the lowest step $860_1$. When a person steps on the lowest step $860_1$, the portable electronic device 200 generates an alert/or a Bluetooth® signal to a mobile device of the person. Thus the person expects to be notified by the alert/or the Bluetooth® signal indicating that it is safe to step off the stepping structure 800, while climbing down the stepping structure 800. Accordingly, a lack of such notification informs the person that the lowest step $860_1$ hasn't arrived during his descent. As a result, the person would be able to avoid skipping the lowest step $860_1$ and prevent misstepping or falling off the stepping structure 800. While FIG. 8 demonstrates an important application of the portable electronic device 200, it is merely an example. The portable electronic device 200 can be used in a wide variety of applications for monitoring and alerting about the presence or absence of an object.

In operation, the portable electronic device 200 is installed on a surface of a structure using the portability mechanism 358. The portable electronic device 200 is positioned adjacent to an area desired to be monitored such that the presence of objects in the area are detected and alerted about. The LED on/off switch 130 on the portable electronic device 200 is turned on and indicates whether the power source 170 is turned on to operate the portable electronic device 200. Infrared radiation from the object(s) is focused into the pyroelectric detector 652 by the lens 230 of the motion detection sensor 110 in the electronic circuit 100 of the portable electronic device 200. The pyroelectric detector 652 converts the radiation into analog signal charges that are then converted to a timed digital TTL output signal by the signal processing integrated circuit 655. The timing on the digital TTL output signal can be achieved through setting the timing potentiometer 654 and the sensitivity potentiometer 656 appropriately and selecting the appropriate trigger buttons 658 and 659.

A BJT 120 electrically coupled to the motion detection sensor 110 receives the digital TTL output signal and activates a control signal. The alert generator 180 generates an alert and/or the Bluetooth® module 160 generates a Bluetooth® signal to a mobile device in response to the control signal. The alert may be a tone, an automated voice or a flashing light. Additionally, the Bluetooth® signal may be interpreted by an application on the mobile device to determine a visual, audible or tactile alert. A person able to receive notification of the alerts in one or more of these ways will thus be informed of the presence or absence of objects and make appropriate inferences and decisions, especially to avoid accidents and injuries.

The portable electronic device 200 described herein can be advantageously used for monitoring and alerting about the presence of an object in a surrounding where the portable electronic device 200 is installed. As non-limiting examples, the portable electronic device 200 can be used in a variety of safety applications such as in decks, porches and anywhere a stepping structure can be present. The portable electronic device 200 can be used to monitor infants away from steps and also as a personal alarm system while biking, hiking and camping overnight. The portable electronic device 200 can thus help reduce the occurrence of accidents and serious injuries in a variety of situations.

The terminology used herein is for the purpose of describing particular aspects only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. The term "or a combination thereof" means a combination including at least one of the foregoing elements.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. An electronic circuit for a portable electronic device used for monitoring and alerting about the presence of an object, the electronic circuit comprising:

a motion detection sensor configured to detect movement of the object across an area in front of the sensor and generate a timed output signal;

a bipolar junction transistor communicatively coupled to the motion detection sensor and configured to activate a control signal in response to the timed output signal;

an alert generator communicatively coupled to the bipolar junction transistor and configured to produce an alert in response to the control signal;

a Bluetooth® module communicatively coupled to the bipolar junction transistor and configured to produce a Bluetooth® signal in response to the control signal;

a power source coupled to the motion detection sensor, the bipolar junction transistor, the alert generator and the Bluetooth® module;

a light-emitting diode (LED) on/off switch communicatively coupled to the power source and configured to indicate whether the power source is turned on or off; and a resistor coupled to the LED on/off switch and configured to step down a voltage input to the LED on/off switch.

2. The electronic circuit of claim 1, wherein the power source comprises a 9V battery, an AA battery, or an AAA battery.

3. The electronic circuit of claim 1 further comprising:
a Zener diode coupled to the power source and configured to regulate voltage to the alert generator and Bluetooth® module, wherein an anode of the Zener diode is coupled to ground and a cathode of the Zener diode is coupled to a circuit node connecting to both the alert generator and the Bluetooth® module.

4. The electronic circuit of claim 1, wherein the alert generator comprises at least one of: an audio speaker, a piezo sounder, a flashing light.

5. The electronic circuit of claim 1, wherein the motion detection sensor comprises a passive infrared motion detector, a laser sensor, an ultrasonic sensor, a microwave sensor, or a proximity sensor.

6. The electronic circuit of claim 1, wherein the motion detection sensor is configured to adjust time of detection between about 3 seconds and about 5 seconds.

7. The electronic circuit of claim 1, wherein the motion detection sensor is configured to adjust sensitivity of detection between about 0.3 meters to about 0.6 meters.

8. A portable electronic device used for monitoring and alerting about the presence of an object, the portable device comprising:
an enclosure having a portability mechanism; and
an electronic circuit positioned within the enclosure, the electronic circuit comprising:
a motion detection sensor configured to detect movement of the object across an area in front of the sensor and generate a timed output signal;
a bipolar junction transistor communicatively coupled to the motion detection sensor and configured to activate a control signal in response to the timed output signal;
an alert generator communicatively coupled to the bipolar junction transistor and configured to produce an alert in response to the control signal;
a Bluetooth® module communicatively coupled to the bipolar junction transistor and configured to produce a Bluetooth® signal in response to the control signal;
a power source coupled to the motion detection sensor, the bipolar junction transistor, the alert generator and the Bluetooth® module;
a light-emitting diode (LED) on/off switch communicatively coupled to the power source and configured to indicate whether the power source is turned on or off; and
a resistor coupled to the LED on/off switch and configured to step down a voltage input to the LED on/off switch.

9. The portable electronic device of claim 8, wherein the power source comprises a 9V battery, an AA battery, or an AAA battery.

10. The portable electronic device of claim 8 further comprising:
a Zener diode coupled to the power source and configured to regulate voltage to the alert generator and Bluetooth® module, wherein an anode of the Zener diode is coupled to ground and a cathode of the Zener diode is coupled to a circuit node connecting to both the alert generator and the Bluetooth® module.

11. The portable electronic device of claim 8, wherein the alert generator comprises at least one of: an audio speaker, a piezo sounder, a flashing light.

12. The portable electronic device of claim 8, wherein the motion detection sensor comprises a passive infrared motion detector, a laser sensor, an ultrasonic sensor, a microwave sensor, or a proximity sensor.

13. The portable electronic device of claim 8, wherein the motion detection sensor is configured to adjust time of detection between about 3 seconds and about 5 seconds.

14. The portable electronic device of claim 8, wherein the motion detection sensor is configured to adjust sensitivity of detection between about 0.3 meters to about 0.6 meters.

15. The portable electronic device of claim 8, wherein the portability mechanism is an industrial grade touch fastener with shear strength of at least 10 pounds per square inch.

16. The portable electronic device of claim 8, wherein the portability mechanism comprises a magnetic fastener configured to attach to one or more steel plates.

17. The portable electronic device of claim 8, wherein the portability mechanism comprises an adaptor plate configured to connect with a C-type clamp.

18. The portable electronic device of claim 8, wherein the enclosure is waterproof.

* * * * *